(12) United States Patent
Bedarida et al.

(10) Patent No.: US 7,573,748 B2
(45) Date of Patent: Aug. 11, 2009

(54) COLUMN LEAKAGE COMPENSATION IN A SENSING CIRCUIT

(75) Inventors: Lorenzo Bedarida, Vimercate (IT); Maria Mostola, Cavenago di Brianza (IT); Davide Manfre', Pandino (IT); Donato Ferrario, Bussero (IT)

(73) Assignee: Atmel Corporation, San Jose, CA (US)

( * ) Notice: Subject to any disclaimer, the term of this patent is extended or adjusted under 35 U.S.C. 154(b) by 32 days.

(21) Appl. No.: 11/652,828

(22) Filed: Jan. 12, 2007

(65) Prior Publication Data

US 2008/0170442 A1 Jul. 17, 2008

(51) Int. Cl.
*G11C 16/06* (2006.01)
(52) U.S. Cl. .............................. 365/185.21; 365/185.2; 365/185.18
(58) Field of Classification Search ............ 365/185.21, 365/185, 2, 185.18
See application file for complete search history.

(56) References Cited

U.S. PATENT DOCUMENTS

| | | | |
|---|---|---|---|
| 5,056,063 A | | 10/1991 | Santin et al. |
| 5,198,997 A | * | 3/1993 | Arakawa ................ 365/185.21 |
| 5,432,746 A | * | 7/1995 | Guedj ......................... 365/202 |
| 5,572,465 A | * | 11/1996 | Bashir .................... 365/185.21 |
| 5,699,295 A | * | 12/1997 | Yero ...................... 365/185.21 |
| 5,859,798 A | * | 1/1999 | Yero ...................... 365/185.25 |
| RE36,579 E | * | 2/2000 | Pascucci et al. ........ 365/185.21 |
| 6,147,893 A | | 11/2000 | Liu |
| 6,185,147 B1 | | 2/2001 | Liu |
| 6,333,885 B1 | * | 12/2001 | Bedarida et al. ............. 365/208 |
| 6,492,844 B2 | | 12/2002 | Terzioglu et al. |
| 6,781,421 B2 | | 8/2004 | Terzioglu et al. |
| 6,873,551 B2 | * | 3/2005 | Bedarida et al. ....... 365/185.21 |
| 7,167,394 B2 | * | 1/2007 | La Placa et al. .......... 365/185.2 |
| 7,254,063 B2 | * | 8/2007 | Mori ..................... 365/185.22 |
| 2004/0095800 A1 | | 5/2004 | Lin et al. |
| 2005/0213387 A1 | * | 9/2005 | Kubo et al. ............ 365/185.21 |

FOREIGN PATENT DOCUMENTS

WO WO-2008/089157 A2 7/2008
WO WO-2008/089157 A3 7/2008

OTHER PUBLICATIONS

"International Application Serial No. PCT/US2008/51023, Search Report and Written Opinion mailed on Sep. 9, 2008", 12 pgs.

* cited by examiner

*Primary Examiner*—Huan Hoang
(74) *Attorney, Agent, or Firm*—Schwegman, Lundberg & Woessner P.A.

(57) ABSTRACT

A sensing circuit. In one embodiment, the sensing circuit includes a memory circuit including a first bitline that sinks a first leakage current, a compensation device coupled to the memory circuit, and a compensation circuit coupled to the compensation device. The compensation circuit includes a second bitline that sinks a second leakage current that matches the first leakage current. The compensation device is operative to compensate the first leakage current through a current based on the second leakage current. According to the system and method disclosed herein, the compensation device and compensation circuit prevents errors when determining the state of the memory cell.

27 Claims, 8 Drawing Sheets

COLUMN LEAKAGE COMPENSATION IN A SENSING CIRCUIT

FIELD OF THE INVENTION

The present invention relates to computer systems, and more particularly to non-volatile memories.

BACKGROUND OF THE INVENTION

Non-volatile memories are well known. Generally, a non-volatile memory is a computer memory that can retain stored information (e.g., a "0" bit or a "1" bit) even when the non-volatile memory is not powered. Flash memories and read-only memories are examples of non-volatile memories. Conventional non-volatile memories typically include a memory array of memory cells (e.g., flash memory cells) that are usually organized by rows and columns inside an array. Typically, the gates of a given memory cells are connected to one row of the array and the drains of the memory cells are connected to a column. To select a given memory cell, the memory cell is precharged/polarized at both the row to which it is connected (i.e., to polarize its gate) and the column/bitline to which it is connected (i.e., to polarize its drain). As discussed below, there are potential problems associated with the polarization of the bitline/drain of the selected memory cell.

In order to correctly read the data item from a memory cell, two phases are involved. The first phase is referred to as a precharge phase. During the precharge phase, a selected memory cell is precharged (e.g., driven to its correct polarization point). The memory cell is polarized at its gate, which, as described above, is connected to a rowline, and is also polarized at its drain, which is connected to a column/bitline. The second phase is referred to as an evaluation phase. During the evaluation phase, a sense amplifier is used to detect the status of the memory cell (e.g., whether it stores a bit value of "1" (e.g., is erased) or, a bit value of "0" (e.g., is programmed)).

Leakage current in bitlines is a well-known problem in design and process engineering. Also, a polarized bitline may sometimes sink a leakage current that is independent of the status of memory cells associated with the bitline. Leakage currents adversely affect the bitline current, which may result in erroneous readings of the memory cells associated with the bitline. Leakage current problems are difficult to address, because the leakage current may be associated with process characteristics and may significantly vary with temperature, voltages, process corners, etc.

Accordingly, what is needed is an improved system and method for addressing leakage current. The present invention addresses such a need.

SUMMARY OF THE INVENTION

A sensing circuit is disclosed. In one embodiment, the sensing circuit includes a memory circuit including a first bitline that sinks a first leakage current, a compensation device coupled to the memory circuit, and a compensation circuit coupled to the compensation device. The compensation circuit includes a second bitline that sinks a second leakage current that matches the first leakage current. The compensation device is operative to compensate the first leakage current through a current based on the second leakage current.

According to the system and method disclosed herein, the compensation device and compensation circuit prevents errors when determining the state of the memory cell.

DETAILED DESCRIPTION OF THE INVENTION

The present invention relates to computer systems, and more particularly to non-volatile memories. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

A sensing circuit is disclosed. In one embodiment, the sensing circuit includes a memory circuit including a bitline that may also sink a leakage current, and includes a compensation circuit that includes a dummy bitline that sinks a generic leakage current that matches the leakage current of the bitline of the memory circuit. The sensing circuit also includes a compensation device coupled between the memory circuit and the compensation circuit. The compensation device is operative to compensate the leakage current of the memory circuit through a current based on the leakage current of the compensation circuit. As a result, the compensation device and compensation circuit prevents errors when determining the state of the memory cell. To more particularly describe the features of the present invention, refer now to the following description in conjunction with the accompanying figures.

Although the present invention disclosed herein is described in the context of standard read operations, the present invention may apply to other types of operations such as read verify operations and test mode read operations, and still remain within the spirit and scope of the present invention.

The sense amplifier can determine the status of the memory cell in various ways. One way is to compare the current at the memory cell to the current of a reference cell, so as to detect the difference between the currents. Another method is to detect, after the precharge phase, if the bitline node at the memory cell (or a node related to it, EVAL_NODE, of FIG. 1) is stable relative to a precharge value. The memory cell stores a "0" bit value (e.g., is programmed) if the memory cell does not sink current, and thus, would not discharge the bitline node (or a node related to it). The memory cell stores a "1" bit value (e.g., is erased) if the memory cell sinks current, and thus, would discharge the bitline node (or a node related to it).

Figure 1:
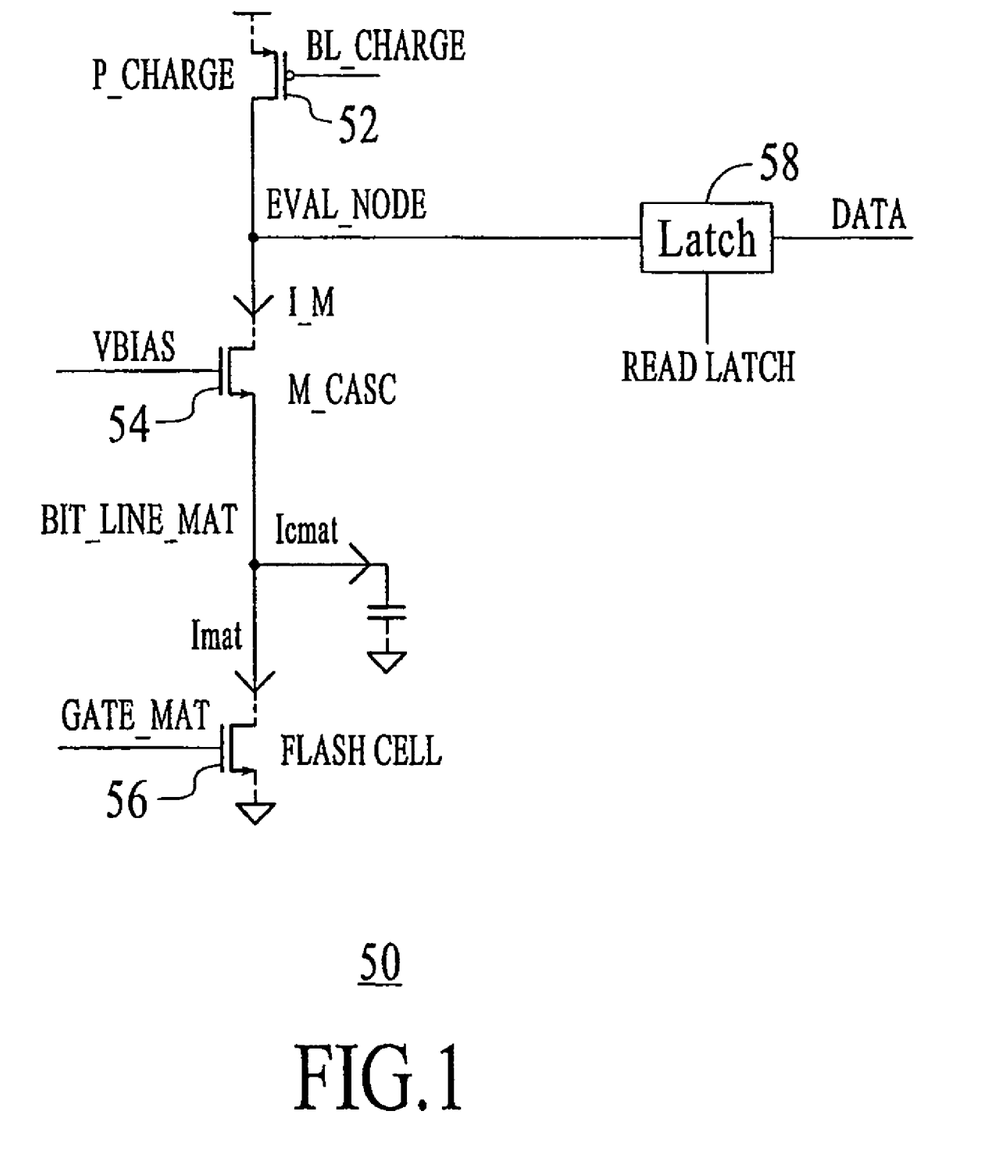
FIG. 1 shows an example memory cell circuit.

It is important, especially with the second method, to ensure that the total current flowing through the bitline is only the real current of the selected memory cell without any type of disturbance. In the second method, the sense amplifier may be implemented with what is referred to as a sense latch, where a single sense amplifier includes a single latch plus a few transistors to bias and precharge the selected bitline (FIG. 1). This type of sense amplifier is very small. Accordingly, it is possible to have a very large density of these sense amplifiers inside of a chip and perform read operations simultaneously.

Although the following example is described in the context of the second method, the present invention may apply to any kind of sense amplifier (current comparison sense amplifiers, with or without cascode transistors, etc.) as well as to various types of operations such as read verify operations and test mode read operations, and still remain within the spirit and scope of the present invention. For ease of illustration, only the case of single level memory (0,1) is shown, but the method may be easily applied to multilevel memory and to any type of memory.

FIG. 1 shows an example memory cell circuit 50. The memory cell circuit 50 includes a load transistor 52, a cascode transistor 54, a memory cell 56, and a latch 58. In operation, assuming the output DATA of latch 58 is high ("1") (e.g., at VCC) at the beginning during the precharge phase, the bitline BIT_LINE_MAT of the selected memory cell 56 is charged (e.g., to about 1V). The charge is controlled by the voltage at the gate VBIAS of the cascode transistor 54. Also, the node EVAL_NODE is charged to VCC. The gate BL_CHARGE of the load transistor 52 is grounded and the gate GATE_MAT of the memory cell 56 is polarized.

During the evaluation phase, voltage at the gate BL_CHARGE of the load transistor 52 raises to VCC. The memory cell 56 sinks current if it stores a "1" bit (i.e., it is erased. The memory cell does not sink current if it stores a "0" bit (i.e., is programmed).

Figure 2A:
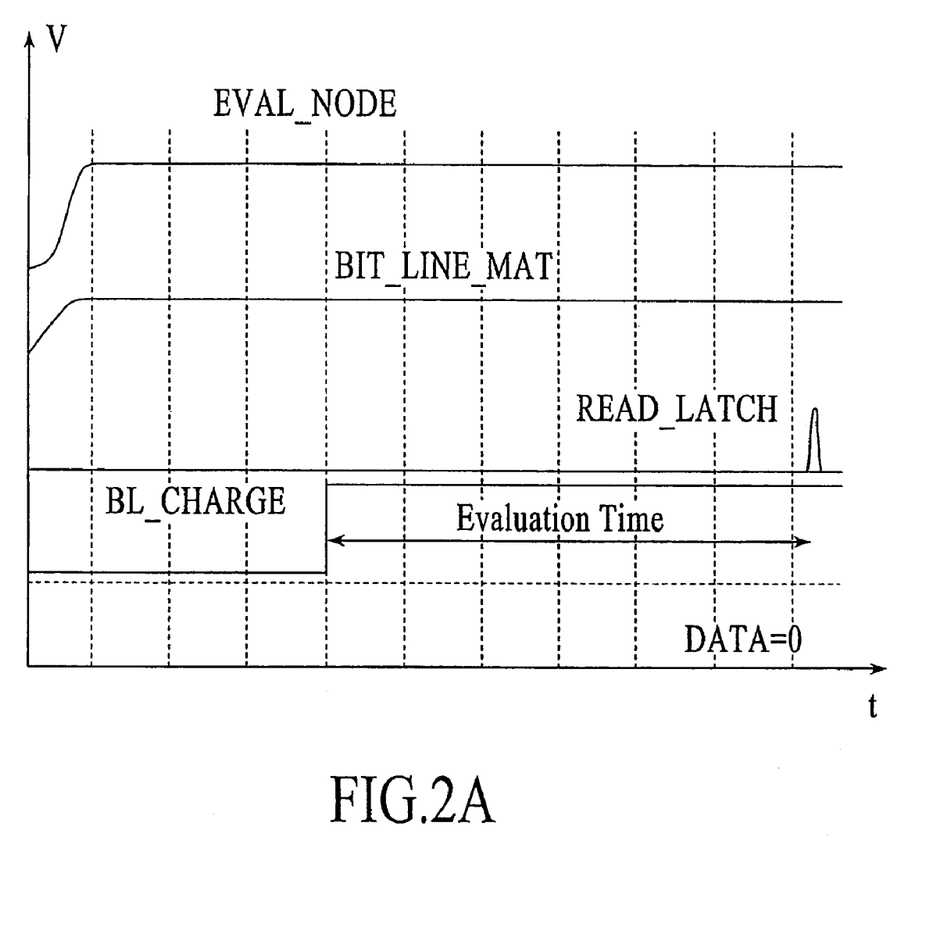
FIGS. 2A and 2B show example readings of the memory cell of FIG. 1.
Figure 2B:
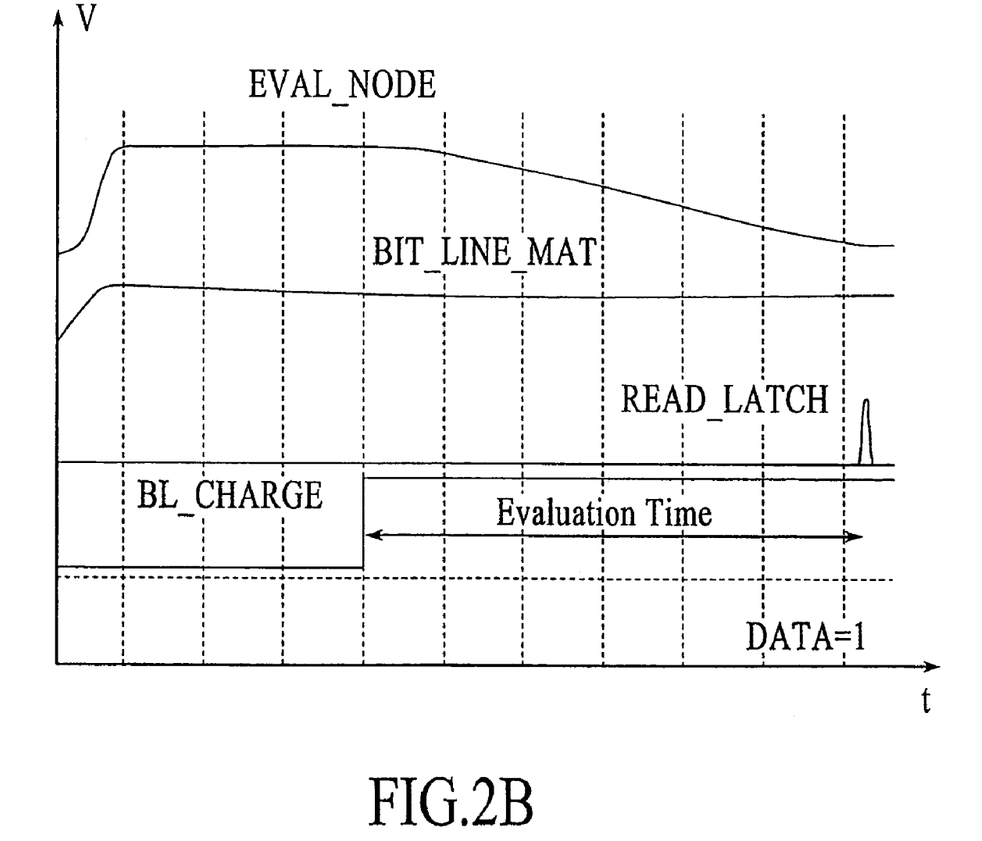

FIGS. 2A and 2B show example readings of a memory cell of FIG. 1. Referring to FIG. 2A, after the precharge phase, the node EVAL_NODE stays at VCC if the memory cell 56 stores a "0" bit (i.e., it is programmed). Referring to FIG. 2B, after the precharge phase, the node EVAL_NODE decreases to ground if the memory cell 56 stores a "1" bit (i.e., it is erased).

During evaluation phase, in one embodiment, the transient precharge current Icmat is zero, and the current I_M discharging the node EVAL_NODE is I_M (FIG. 1) and is equal to memory cell current Imat such that it is greater than 0 if the memory cell 56 stores a one bit. If the memory cell 56 stores a one bit, the node EVAL_NODE is discharged by the current I_M, which can be very low since it is equal to the current Imat.

The maximum time in which this node has to change (usually from high to low) is determined by the signal READ_LATCH, which defines the end of the read.

When reading a one bit, there needs to be a sufficient amount of time to allow the voltage at the node EVAL_NODE to decrease enough to reach the trigger point of the latch 58 (or comparator). The voltage at that node also needs to be at an appropriate level so as to avoid affecting the output of the latch 58, which was preset to VCC, in order to maintain the correct "1" bit at the output node DATA.

Generally, more time is required to read a "1" bit (i.e., erased state), because it takes time to discharge the node EVAL_NODE, which may be far from the trigger point of the latch 58.

Column or bitline leakage is a well-known design and process problem. A polarized bitline may sometimes sink a leakage current Ileak independent of the status of the bitline (e.g., even if the selected memory cell 56 stores a zero bit). The leakage current Ileak is present even when all of the memory cells belonging to the selected bitline are storing a zero bit. Unfortunately, the leakage current is added to the current of the selected memory cell. Accordingly, the current I_M is not equal to the current Icell of the memory cell current (Icell=Imat) as might be expected. Instead, the current I_M is equal to the current Imat plus the leakage current Ileak (i.e., I_M=Imat+Ileak). Consequently, I_M=Ileak if the memory cell is programmed, since Imat=0. The leakage current Ileak is present even if no memory cell is selected, as long as the bitline is being polarized.

There are various causes of the leakage current including, for example, junction leakage, column selector leakage, ground selector leakage, low thresholds, etc. The leakage current Ileak is particularly present where there are long bitlines with many column selectors. This is the case, for example, with NAND flash memories, which can have a series of 8, or 16, or more single flash memory cells, each connected to the bitline by a column selector transistor and connected to a ground by a source/ground selector transistor. Accordingly, the current of the flash memory cell being significantly low makes the flash memory particularly vulnerable to the leakage current Ileak. This leakage current problem is common with other types of memories as well.

Figure 3:
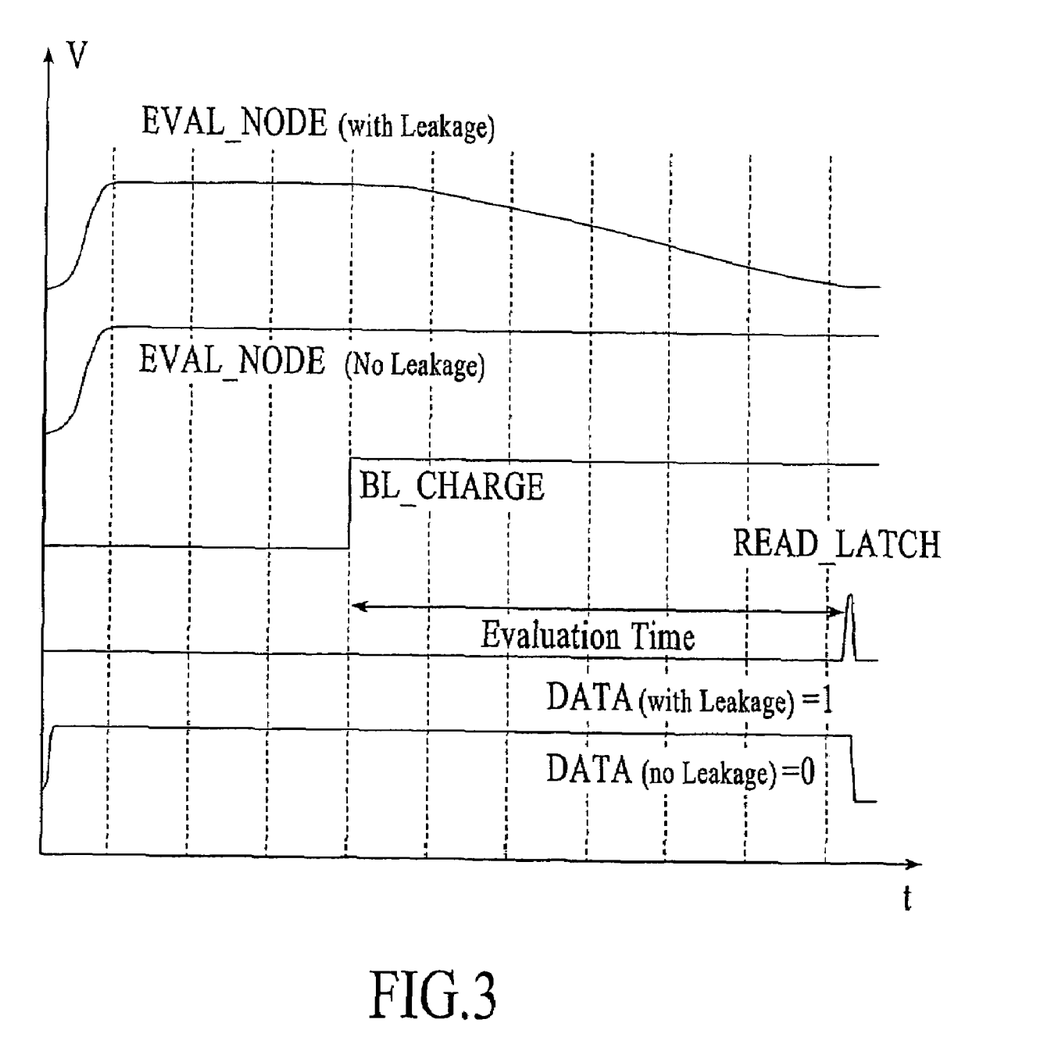
FIG. 3 shows example results where leakage current is present and where leakage current is not present.

FIG. 3 shows example results where leakage current is present and where leakage current is not present. Referring to both FIGS. 1 and 3 together, where the leakage current Ileak is present, the discharge current I_M during the evaluation phase is the sum of the memory current Imat plus the current leakage Ileak: I_M=Icell+Ileak, where Icell=Imat. As a result, the leakage current Ileak can cause a failure during a programmed cell read.

This is due to the fact that even if the sense amplifier is reading a programmed bit (i.e., a zero bit), the addressed bitline after the precharge phase becomes discharged due to the leakage current Ileak, and slowly decreases such that I_M=Icell+Ileak=Ileak, since Icell=0. Consequently, a "1" bit would erroneously be read out of the output node DATA instead of a correct "0" bit.

This problem may be avoided if the signal READ_LATCH is not so late that the node EVAL_NODE decreases enough to trigger the latch 58 to output a "1" bit (i.e., erroneously read as erased) instead of a zero bit. Finding the appropriate timing for the signal READ_LATCH is difficult. If it is too late in the evaluation phase, it may erroneously read a "1" bit instead of a zero bit. If it is too early, it may erroneously read a "0" bit instead of a one bit, since the memory cell would not be able in such a reduced time be able to sufficiently discharge the node EVAL_NODE.

Figure 4:
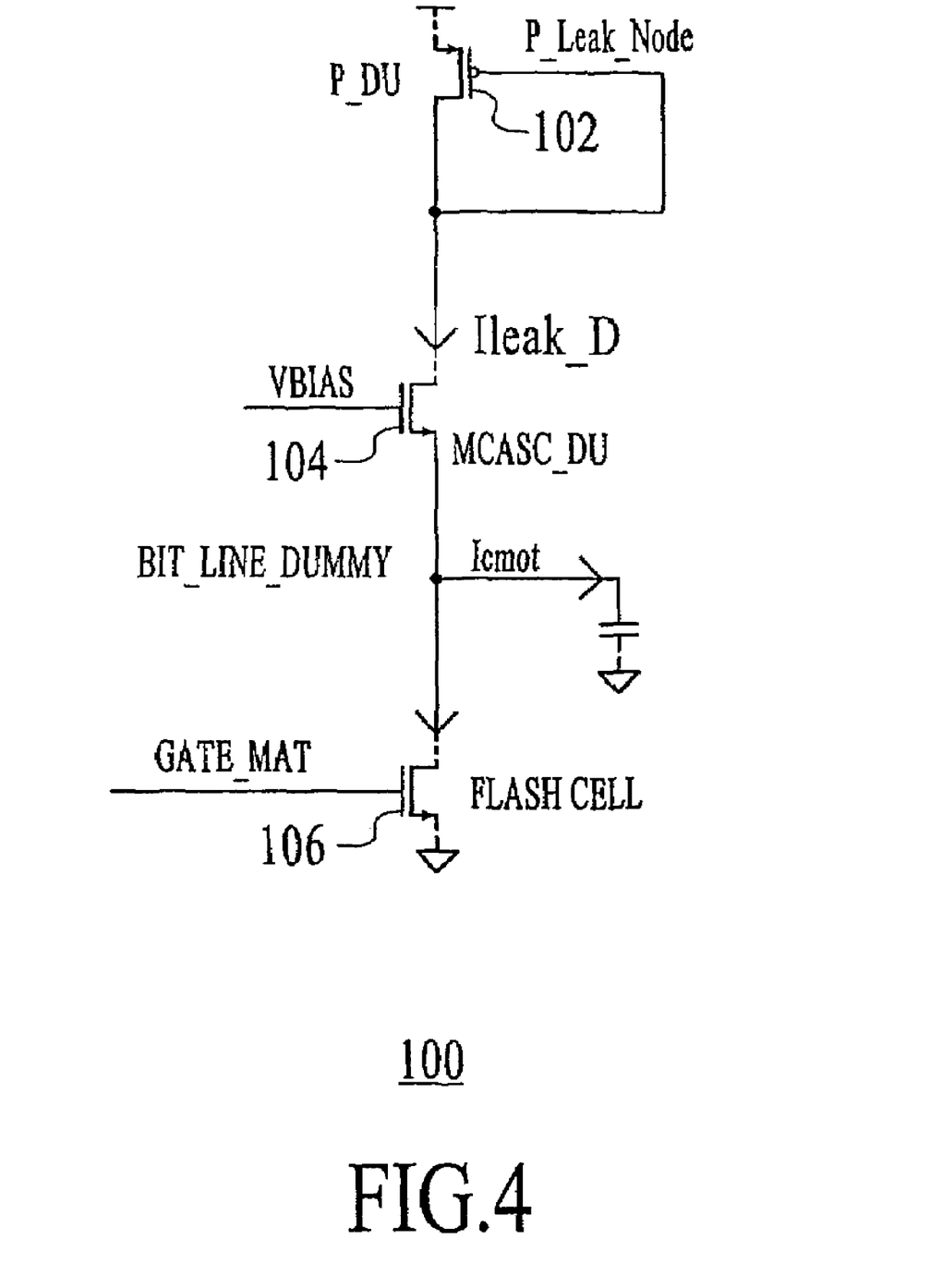
FIG. 4 shows an example memory cell circuit in accordance with one embodiment.

FIG. 4 shows an example memory cell circuit 100 in accordance with one embodiment. The memory cell circuit 100 includes a load transistor 102, a cascode transistor 104, and a memory cell 106. The memory cell circuit 100 includes a "dummy" bitline, which is identical to the other bitlines of the memory array. For example, it may have the same circuit, the same number of memory cells and column selectors, and it may be polarized in the same way as the other ones. However, it would not have the same memory cell current contribution, because its memory cells are physically or electrically turned off, or selectors are physically or electrically turned off, or all rows are grounded or all coupled together.

Although embodiments of the present invention disclosed herein are described in the context of the memory circuit shown in FIG. 4, embodiments of the present invention may apply to other circuit configurations, and still remain within the spirit and scope of the present invention.

As FIG. 4 shows, the load transistor 104 is configured as a P-channel diode and sinks the current required to polarize the dummy bitline (labeled BIT_LINE_DUMMY). The value of the dummy bitline voltage is fixed by the value of gate VBIAS of the cascode 104. After the dummy bitline is polarized, the dummy bitline leakage current (named) Ileak_D is able to track the bitline leakage (named Ileak_M) of the memory array in any temperature, voltage, process corner, etc.

Figure 5:
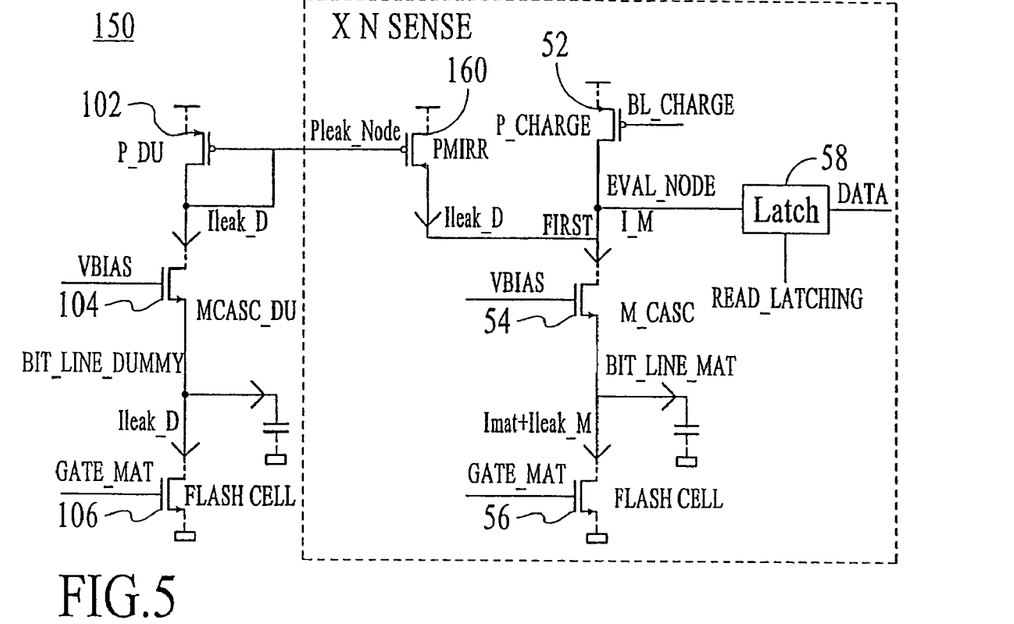
FIG. 5 shows a sensing circuit in accordance with one embodiment.

FIG. 5 shows a sensing circuit 150 in accordance with one embodiment. The sensing circuit 150 includes one or more memory circuits similar to that of FIG. 1 and a memory circuit similar to that of FIG. 4. For ease of illustration, only one memory circuit is shown. Also, like reference numbers are used. The sensing circuit also includes a transistor 160. In one embodiment, the transistor 160 may be a P-channel transistor.

In operation, the leakage current Ileak_D of the dummy bitline is utilized to compensate the leakage current Ileak_M of the selected memory circuit. While a mirror circuitry configuration is used, other configurations may also be used.

For each sense amplifier of the memory array, a transistor such as the transistor 160 is added. In one embodiment, the transistor 160 has a gate P_Leak_Node coming from the polarization circuitry of the dummy bitline. In one embodiment, one dummy bitline may be utilized for all sensing circuits of the memory array. Alternatively, in one embodiment, one bitline dummy may be utilized for each sensing circuits of the memory array for physically closer proximity.

As FIG. 5 shows, the drain of the transistor 160 may be connected to the drain or alternatively to the source of the cascode transistor 54 drain, or in any other point that would allow to sink the dummy bitline leakage current Ileak_D to the bitline BIT_LINE_MAT or to the EVAL_NODE.

The transistor 102 sinks the bitline leakage current Ileak_D, and the transistor 160 being in a mirror configuration, sinks the same amount of current Ileak_D as the transistor 102, assuming they have the same dimensions. Alternatively, in another embodiment, the transistors 102 and 160 may have different dimensions in order to reduce space. As such, in one embodiment, a mirror may be placed between the transistors 102 and 160.

Figure 6:
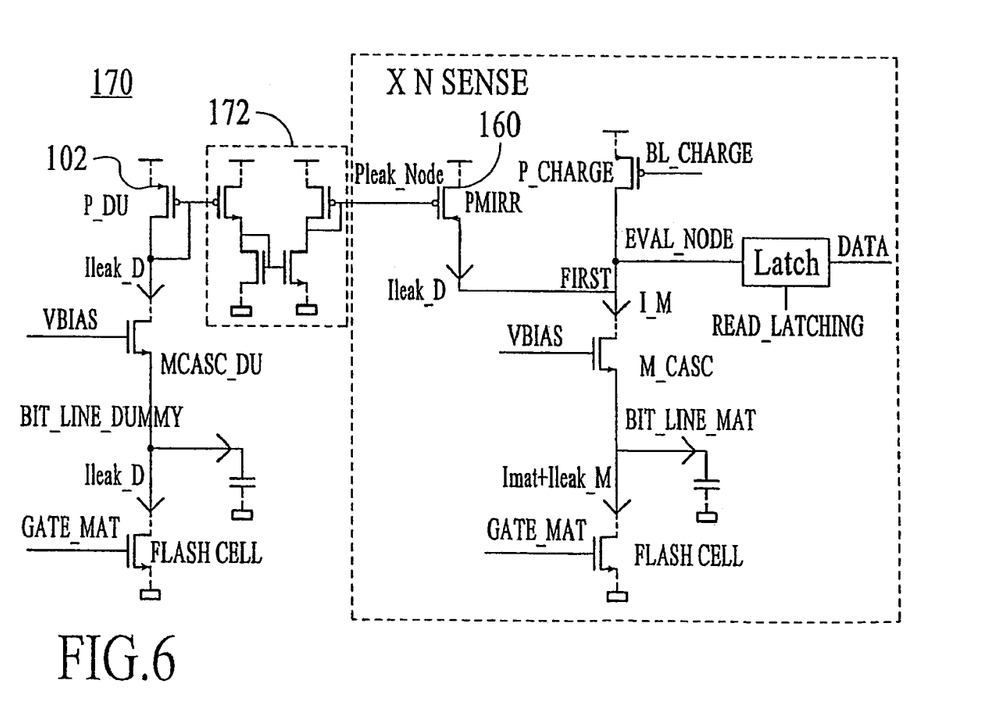
FIG. 6 shows a sensing circuit in accordance with another embodiment.

FIG. 6 shows a sensing circuit 170 in accordance with another embodiment. The sensing circuit 170 includes a mirror 172 between transistors 102 and 160. The mirror 172 allows the transistors 102 and 160 to have different dimensions yet sink the same amount of current.

Referring again to FIG. 5, during the evaluation phase, the matrix selected bitline leakage current is Ileak_M, the dummy bitline leakage current is Ileak_D. The following equations describe the behavior of the sensing circuit 150: I_M=Imat+Ileak_M−Ileak_D, where it is assumed that Ileak_D=Ileak_M and so I_M=Imat. These relationships would be the same even if the drain of transistor 160 were connected to the source of the transistor 54. In the case of a programmed memory cell where the memory cell 56 stores a zero bit, Imat=0 and thus I_M=0.

Figure 7:
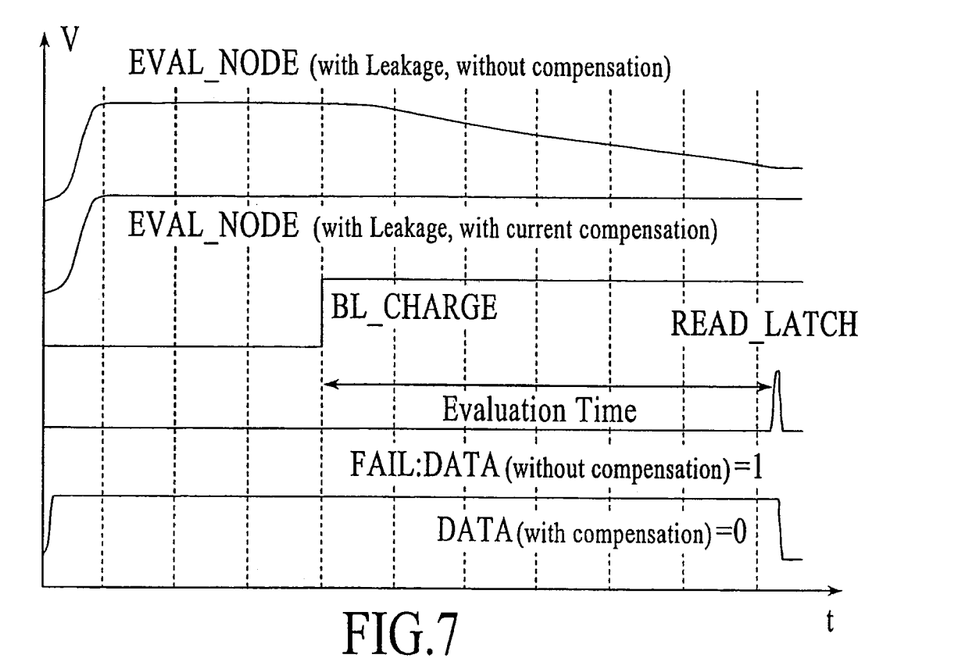
FIG. 7 shows example results where leakage current is compensated and where leakage current is not compensated.

FIG. 7 shows example results where the matrix selected bitline leakage current Ileak_M is compensated by dummy bitline leakage current Ileak_D and where the matrix selected bitline leakage current is not compensated. As FIG. 7 shows, when reading a programmed memory cell, the node EVAL_NODE remains high with leakage current compensation but decreases over time without leakage current compensation.

In one embodiment, the transistor 160 may be implemented with a P-channel transistor as shown in FIG. 5. The P-channel transistor may be of a minimal size in order to save space. In another embodiment, another other appropriate device may be used instead of the transistor 160. In an alternative embodiment, an existing transistor of the sensing circuit 150 may be utilized instead of the transistor 160. For example, the transistor 52 could be used during the precharge phase, as usual, to charge the node EVAL_NODE until it reaches VCC. During this phase, the gate of the transistor 52 would be grounded. After this phase, the transistor 52 usually is typically turned off, because its gate is set to VCC. However, in one embodiment, in this phase, it could be chosen to not turn the transistor 52 off, and it could be used instead of transistor 160 to sink the dummy bitline current Ileak_D.

Figure 8:
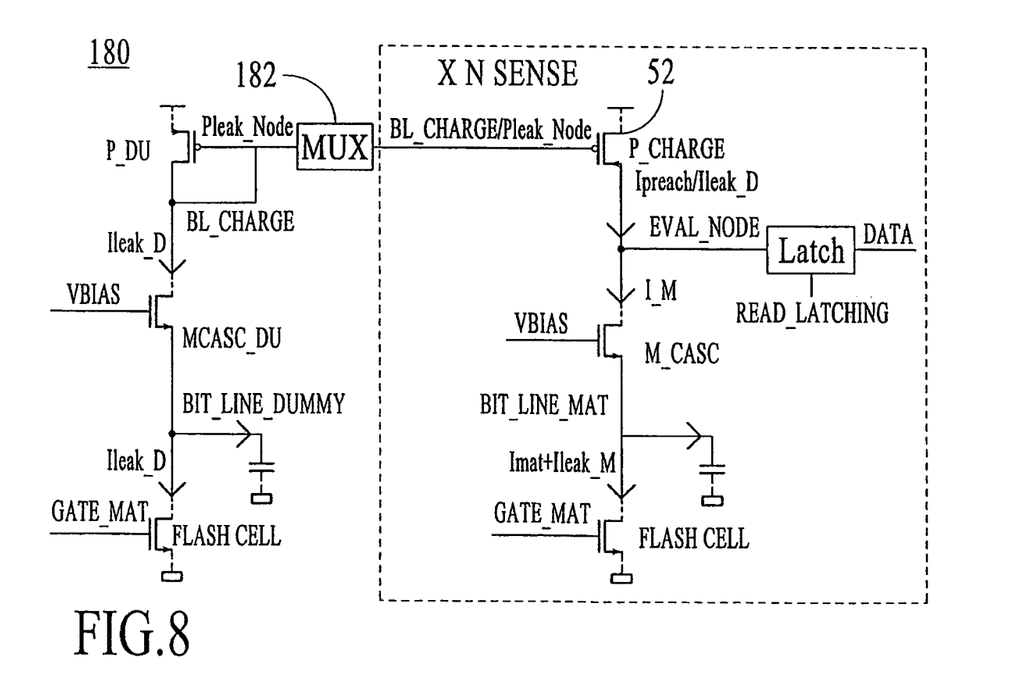
FIG. 8 shows an example sensing circuit in accordance with another embodiment.

FIG. 8 shows an example sensing circuit 180 in accordance with another embodiment. As FIG. 8 shows, a multiplexer or mux 182 is utilized. In one embodiment, during the precharge phase, the mux 182 couples the gate of the transistor 52 to the node BL_CHARGE (that is grounded) so that the transistor 52 charges the node EVAL_NODE. During the evaluation phase, the mux 182 couples the gate of the transistor 52 to the node P_Leak node to sink the dummy bitline leakage current Ileak_D. As such, no additional circuitry is needed in the basic scheme of sensing circuit 180. This maintains minimal space.

Figure 9:
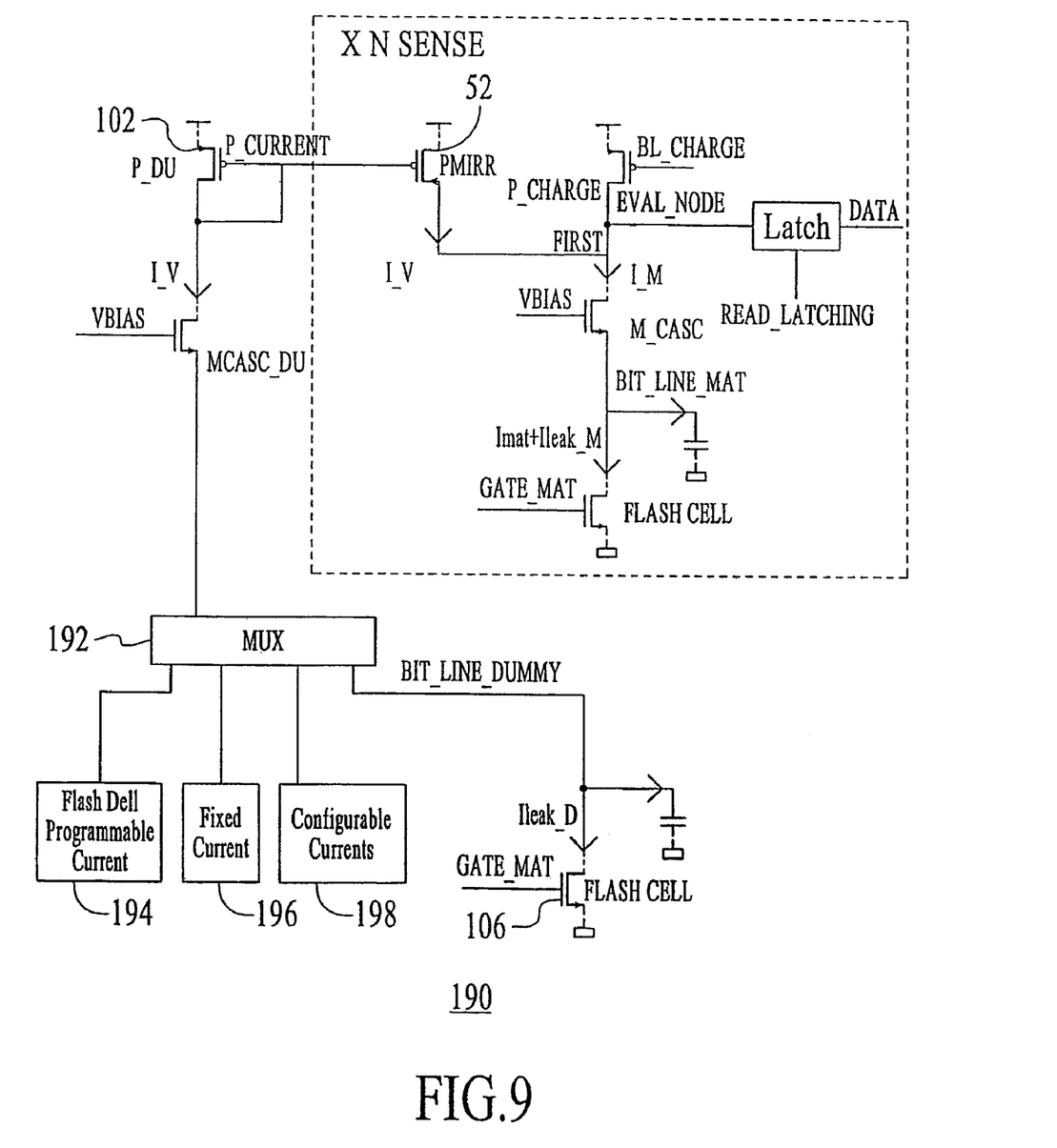
FIG. 9 is an example sensing circuit in accordance with another embodiment.

FIG. 9 is an example sensing circuit 190 in accordance with another embodiment. The sensing circuit 190 includes one or more memory circuits similar to that of FIG. 1. The sensing circuit 190 includes a memory circuit similar to that of FIG. 4, except that it also includes a mux 192, a programmable current unit 194 for having any possible current value, a fixed current unit 196 or other appropriate current source (e.g., an external tester) for providing a fixed current, and a configurable current unit 198 having a selectable set of current values. As such, the sensing circuit 190 makes it possible to inject any desired current in a given addressed bitline controlling the gate of the transistor 52 according to the current to be injected.

The sensing circuit of FIG. 9 is also particularly useful in test modes to quickly obtain memory cell threshold distributions and accelerate debugging processes, especially in NAND flash memory architecture. This approach enables compensation of the matrix leakage current in several ways, in particular using a dummy bitline or using, as also shown, any other possible types of current. Moreover, it is very important to stress that, independent of possible matrix leakage problems, this method may also be used exclusively to significantly speed up testing and debugging of a chip.

The sensing circuit 190 may be used to perform simple current comparisons in order to optimize the memory array for faster test modes involving, for example, memory cell threshold/current distribution. The sensing circuit 190 provides the injection of any desired current and in particular accelerates memory cell threshold/current distributions, since access time is many times faster with respect to using, for example, a standard direct memory current measurement. Moreover, many memory cells may be read in parallel.

According to the system and method disclosed herein, the present invention provides numerous benefits. For example, the compensation device and compensation circuit prevent errors when determining the state of the memory cell. Embodiments of the present invention also enable injection any kind of current value to the selected bitline in order to compensate matrix selected bitline leakage or also to facilitate various testing and troubleshooting procedures.

A sensing circuit has been disclosed. In one embodiment, the sensing circuit includes a memory circuit including a bitline that sinks a leakage current, and includes a compensation circuit that includes a dummy bitline that sinks a leakage current that matches the leakage current of bitline of the memory circuit, and a compensation device that is operative to compensate, through a current based on the leakage current of the compensation circuit, the leakage current of the memory circuit.

The present invention has been described in accordance with the embodiments shown. One of ordinary skill in the art will readily recognize that there could be variations to the embodiments, and that any variations would be within the spirit and scope of the present invention. For example, embodiments may be applied to any type of memory and any type of sense amplifier. Accordingly, embodiments may be utilized for a current comparison sense amplifier and for a sense amplifier without a cascode transistor. Accordingly, many modifications may be made by one of ordinary skill in the art without departing from the spirit and scope of the appended claims.

What is claimed is:

1. An apparatus comprising:
a memory cell to store data;
a first bitline to carry a first current based on a value of the data stored in the memory cell when the memory cell is read; and
a second bitline;
a circuit coupled to the first and second bitlines to compensate a first leakage current on the first bitline with a second leakage current on the second bitline, wherein the circuit is configured such that a value of the first leakage current is equal to a value of the second leakage current, and the circuit includes a latch configured to provide a value of the data read from the memory cell based on the first current.

2. The apparatus of claim 1 wherein the circuit comprises a transistor coupled to the first bitline to provide a third current based on a second current on the second bitline to the first bitline through one of a source and a drain of the transistor.

3. The apparatus of claim 2 wherein the circuit comprises a mirror circuit coupled between the second bitline and the transistor.

4. The apparatus of claim 3 wherein the circuit further comprises an additional transistor to provide at least a portion of the second current to the second bitline, and wherein the additional transistor has different dimensions from dimensions of the transistor.

5. The apparatus of claim 1 further comprising a transistor to provide at least a portion of the first current, wherein the circuit comprises a multiplexer to selectively couple a gate of the transistor to a node and to a gate of an additional transistor of the circuit.

6. The apparatus of claim 5 wherein the multiplexer is configured to couple the gate of the transistor to the node during a first phase of a reading of the memory cell and couple the gate of the transistor to the gate of the additional transistor during a second phase of the reading of the memory cell.

7. The apparatus of claim 1 further comprising:
a first transistor coupled to the memory cell;
a second transistor coupled to the first transistor; and
a latch responsive to a voltage at a node between the first and second transistors to provide the data read from the memory cell to an output node.

8. The apparatus of claim 1 wherein the circuit comprises:
a multiplexer coupled to the second bitline; and
a plurality of current units for controlling a second current on the second bitline.

9. The apparatus of claim 8 wherein the plurality of current units are configured for controlling the second current such that the second current includes one of a fixed current value and a set of selectable current values.

10. The apparatus of claim 8 wherein the plurality of current units are configured to inject a current to one of the first and second bitlines during a test.

11. The apparatus of claim 8 wherein the circuit is configured to obtain memory cell threshold distributions.

12. The apparatus of claim 1 further comprising an additional memory cell coupled to the second bitline, wherein a second current on the second bit line has a value based on a value of a data stored in the additional memory cell.

13. A system comprising:
a processor;
a memory cell to store data;
a first bitline to carry a first current based on a value of the data stored in the memory cell when the memory cell is read; and
a second bitline;
a circuit coupled to the first and second bitlines to compensate a first leakage current on the first bitline with a second leakage current on the second bitline, wherein the circuit is configured such that a value of the first leakage current is equal to a value of the second leakage current, and the circuit includes a latch configured to provide a value of the data read from the memory cell based on the first current.

14. The system of claim 13 wherein the circuit comprises a transistor coupled to the first bitline to provide a third current based on a second current on the second bitline to the first bitline through one of a source and a drain of the transistor.

15. The system of claim 14 wherein the circuit comprises a mirror circuit coupled between the second bitline and the transistor.

16. The system of claim 15 wherein the circuit further comprises an additional transistor to provide at least a portion of the second current to the second bitline, and wherein the additional transistor has different dimensions from dimensions of the transistor.

17. The system of claim 13 further comprising a transistor to provide at least a portion of the first current, wherein the circuit comprises a multiplexer to selectively couple a gate of the transistor to a node and to a gate of an additional transistor of the circuit.

18. The system of claim 17 wherein the multiplexer is configured to couple the gate of the transistor to the node during a first phase of a reading of the memory cell and couple the gate of the transistor to the gate of the additional transistor during a second phase of the reading of the memory cell.

19. The system of claim 13 further comprising:
a first transistor coupled to the memory cell;
a second transistor coupled to the first transistor; and
a latch responsive to a voltage at a node between the first and second transistors to provide the data read from the memory cell to an output node.

20. The system of claim 13 wherein the circuit comprises:
a multiplexer coupled to the second bitline; and
a plurality of current units for controlling a second current on the second bitline.

21. The system of claim 20 wherein the plurality of current units are configured for controlling the second current such that the second current includes one of a fixed current value and a set of selectable current values.

22. The system of claim 20 wherein the plurality of current units are configured to inject a current to one of the first and second bitlines during a test.

23. The system of claim 20 wherein the circuit is configured to obtain memory cell threshold distributions.

24. A method comprising:
generating a first current on a first bitline that is coupled to a memory cell;
compensating a first leakage current on the first bitline with a second leakage current on a second bitline, the first leakage current and the second leakage current having a same value; and
providing a value of a data read from the memory cell based on the first current.

25. The method of claim 24 wherein compensating the first leakage current comprises:
providing at least a portion of a second current on the second bitline to the first bitline.

26. The method of claim 24 further comprising:
injecting a current with different values to one of the first and second bitlines during a test of the memory cell.

27. The method of claim 24 further comprising obtaining memory cell threshold distributions during a test.

* * * * *